United States Patent
Bloss et al.

(10) Patent No.: US 11,372,035 B2
(45) Date of Patent: Jun. 28, 2022

(54) MEASUREMENT SYSTEM AND METHOD FOR MATCHING AND/OR TRANSMISSION MEASUREMENTS

(71) Applicant: Rohde & Schwarz GmbH & Co. KG, Munich (DE)

(72) Inventors: Martin Bloss, Munich (DE); Thomas Maier, Buchbach (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 129 days.

(21) Appl. No.: 16/199,960

(22) Filed: Nov. 26, 2018

(65) Prior Publication Data

US 2020/0166553 A1 May 28, 2020

(51) Int. Cl.
*H04B 1/38* (2015.01)
*G01R 27/04* (2006.01)
*G01R 27/28* (2006.01)

(52) U.S. Cl.
CPC ............ *G01R 27/04* (2013.01); *G01R 27/28* (2013.01)

(58) Field of Classification Search
CPC ..... G01J 2003/283; G01J 3/28; G01R 31/311; G01R 27/28; G01R 27/04; H03F 3/24
See application file for complete search history.

(56) References Cited

U.S. PATENT DOCUMENTS

| | | | |
|---|---|---|---|
| 3,903,477 A | 9/1975 | Cronson et al. | |
| 6,052,190 A * | 4/2000 | Sekowski | G01S 7/497 356/601 |
| 2010/0102829 A1* | 4/2010 | Azarian | G01R 27/28 324/651 |
| 2012/0020669 A1* | 1/2012 | Margraf | H04B 10/64 398/115 |
| 2017/0111081 A1* | 4/2017 | Koch | G11C 7/062 |

* cited by examiner

*Primary Examiner* — Alesa Allgood
(74) *Attorney, Agent, or Firm* — Ditthavong, Steiner & Mlotkowski (57) ABSTRACT

A measurement system for matching and/or transmission measurements with respect to a device under test comprising an interface is provided. Said measurement system comprises at least one signal generator comprising at least one signal generator signal path, and at least one receiver comprising at least two receiver signal paths. In this context, a signal of a first signal generator signal path of the at least one signal generator signal path and/or a signal of a first receiver signal path of the at least two receiver signal paths is adaptively phase-shifted and/or amplitude-modified with respect to a signal of a second receiver signal path of the at least two receiver signal paths.

22 Claims, 3 Drawing Sheets

MEASUREMENT SYSTEM AND METHOD FOR MATCHING AND/OR TRANSMISSION MEASUREMENTS

TECHNICAL FIELD

The invention relates to a measurement system and a corresponding measurement method for matching and/or transmission measurements with respect to a device under test, especially a radio frequency device under test, comprising an interface.

BACKGROUND ART

Generally, in times of an increasing number of applications employing a plurality of electrical circuits, especially radio frequency circuitry, there is a growing need of a measurement system and a corresponding measurement method especially for verifying correct functioning of said applications in a highly efficient and accurate manner with special respect to matching and transmission measurements.

U.S. Pat. No. 3,903,477 discloses a measurement method in which the forward and backward scattered energy of a high frequency network or composition of matter exposed to a composite electromagnetic energy wave is sampled by a compensated sampling system and the incident wave and reflected and transmitted response waves are employed in performing discrete Fourier transformations in a computation process yielding the complex electrical characteristics of the network or composition of matter. As it can be seen, due to the complexity of said measurement method and the usage of error-prone processes such as the discrete Fourier transformations, the foregoing measurement method can disadvantageously not ensure an efficient and accurate measurement with special respect to matching and transmission.

Accordingly, there is a need to provide a measurement system and a corresponding measurement method for matching and/or transmission measurements with respect to a device under test, whereby said measurements can be performed in a highly efficient and accurate manner.

SUMMARY OF THE INVENTION

According to a first aspect of the invention, a measurement system for matching and/or transmission measurements with respect to a device under test comprising an interface is provided. Said measurement system comprises at least one signal generator comprising at least one signal generator signal path, and at least one receiver comprising at least two receiver signal paths. In this context, a signal of a first signal generator signal path of the at least one signal generator signal path and/or a signal of a first receiver signal path of the at least two receiver signal paths is adaptively phase-shifted and/or amplitude-modified with respect to a signal of a second receiver signal path of the at least two receiver signal paths.

Alternatively, especially in the case that the at least one signal generator comprises at least two signal generator signal paths, a signal of a first signal generator signal path of the at least one signal generator signal path and/or a signal of a first receiver signal path of the at least two receiver signal paths is adaptively phase-shifted and/or amplitude-modified with respect to a signal of a second receiver signal path of the at least two receiver signal paths and/or a signal of a second signal generator signal path of the at least two signal generator signal paths.

Advantageously, in this manner, the stability of calibration can be increased, which allows for highly accurate and efficient measurements. Further advantageously, asymmetry of at least one directive element of the measurement system may preferably be adjusted and/or compensated. In addition to this, as a further advantage, a balun is not necessary especially in order to realize the directivity of at least one component of the measurement system, which leads to an increased measurement efficiency.

According to a first preferred implementation form of the first aspect of the invention, the at least one signal generator comprises at least two signal generator signal paths. Advantageously, a multi-path signal generator may be used, which may allow for an increased measurement efficiency.

According to a second preferred implementation form of the first aspect of the invention, the signal of the first signal generator signal path of the at least two signal generator signal paths and/or the signal of the first receiver signal path of the at least two receiver signal paths is adaptively phase-shifted and/or amplitude-modified with respect to a signal of a second signal generator signal path of the at least two signal generator signal paths. Advantageously, measurement accuracy can further be increased.

According to a further preferred implementation form of the first aspect of the invention, the measurement system further comprises a measurement bridge, especially a resistive measurement bridge, for interconnecting at least two of the at least one signal generator, the at least one receiver, and the device under test. Advantageously, especially in the case that a directivity of the measurement bridge is desired, a balun is not necessary for realizing said directivity of the measurement bridge, thereby increasing measurement efficiency.

According to a further preferred implementation form of the first aspect of the invention, the measurement bridge is adjustable in amplitude and/or phase with respect to the at least one signal generator signal path. Advantageously, not only measurement efficiency but also measurement accuracy can be increased.

According to a further preferred implementation form of the first aspect of the invention, the measurement bridge is adjustable in amplitude and/or phase with respect to the at least two receiver signal paths. Advantageously, both measurement accuracy and measurement efficiency can be increased.

According to a further preferred implementation form of the first aspect of the invention, the first signal generator signal path is connected to the first receiver signal path and/or the second receiver signal path and/or the interface of the device under test.

Alternatively, the first signal generator signal path may be connected via at least one of a power divider, a resistor, a capacitor, or an inductor to the first receiver signal path and/or the second receiver signal path and/or the interface of the device under test.

Advantageously, for instance, especially due to a reduced complexity, both measurement efficiency and measurement accuracy can be increased.

According to a further preferred implementation form of the first aspect of the invention, the first signal generator signal path is connected to the first receiver signal path and/or the second receiver signal path and/or the interface of the device under test and/or a second signal generator signal path of the at least two signal generator signal paths.

Alternatively, the first signal generator signal path may be connected via at least one of a power divider, a resistor, a capacitor, or an inductor to the first receiver signal path and/or the second receiver signal path and/or the interface of the device under test and/or a second signal generator signal path of the at least two signal generator signal paths.

Advantageously, for example, complexity can be reduced, thereby increasing not only measurement efficiency but also measurement accuracy.

According to a further preferred implementation form of the first aspect of the invention, a second signal generator signal path of the at least two signal generator signal paths is connected to the interface of the device under test and/or the first receiver signal path and/or the second receiver signal path and/or the first signal generator signal path.

Alternatively, a second signal generator signal path of the at least two signal generator signal paths may be connected via at least one of a power divider, a resistor, a capacitor, or an inductor to the interface of the device under test and/or the first receiver signal path and/or the second receiver signal path and/or the first signal generator signal path.

Advantageously, for instance, complexity can further be reduced, which leads to an increased measurement efficiency and measurement accuracy.

According to a further preferred implementation form of the first aspect of the invention, the interconnection with the aid of the measurement bridge comprises a connection in which the first signal generator signal path is connected to the first receiver signal path and/or the second receiver signal path and/or the interface of the device under test. In this context, it is noted that said connection of the measurement bridge comprises at least one of a power divider, a resistor, a capacitor, or an inductor. Advantageously, measurement efficiency and measurement accuracy can further be increased.

According to a further preferred implementation form of the first aspect of the invention, especially in the case that the at least one signal generator comprises at least two signal generator signal paths, the interconnection with the aid of the measurement bridge comprises a connection in which the first signal generator signal path is connected to the first receiver signal path and/or the second receiver signal path and/or the interface of the device under test and/or a second signal generator signal path of the at least two signal generator signal paths. In this context, it is noted that said connection of the measurement bridge comprises at least one of a power divider, a resistor, a capacitor, or an inductor. Advantageously, not only measurement accuracy but also measurement efficiency can further be increased.

According to a further preferred implementation form of the first aspect of the invention, especially in the case that the at least one signal generator comprises at least two signal generator signal paths, the interconnection with the aid of the measurement bridge comprises a connection in which a second signal generator signal path of the at least two signal generator signal paths is connected to the interface of the device under test and/or the first receiver signal path and/or the second receiver signal path and/or the first signal generator signal path. In this context, it is noted that said connection of the measurement bridge comprises at least one of a power divider, a resistor, a capacitor, or an inductor. Advantageously, for instance, both measurement efficiency and measurement accuracy can further be increased.

According to a further preferred implementation form of the first aspect of the invention, the at least one receiver comprises two receivers. Advantageously, said two receivers may preferably replace the at least two signal receiver signal paths.

According to a further preferred implementation form of the first aspect of the invention, the measurement system further comprises a processor for measuring the grade of nulling of the signal of the second receiver signal path. Advantageously, for example, measurement efficiency can further be increased.

According to a further preferred implementation form of the first aspect of the invention, especially in the case that the at least one signal generator comprises at least two signal generator signal paths, the processor is adapted to sweep phase and/or amplitude difference between the at least two signal generator signal paths and/or the at least two receiver signal paths on the basis of the measured grade of nulling. Advantageously, for instance, measurement accuracy can further be increased.

According to a further preferred implementation form of the first aspect of the invention, the processor comprises at least one of an application-specific integrated circuit, a digital signal processor, or a field programmable gate array. Advantageously, costs can be reduced, thereby increasing measurement efficiency.

According to a further preferred implementation form of the first aspect of the invention, the measurement system further comprises a processor for measuring the grade of nulling of the signal in the first receiver signal path. Advantageously, the processor for measuring the grade of nulling of the signal in the first receiver signal path may be equal to the processor for measuring the grade of nulling of the signal of the second receiver signal path. Advantageously, for instance, measurement efficiency can further be increased.

According to a further preferred implementation form of the first aspect of the invention, especially in the case that the grade of nulling of the signal in the first receiver signal path is measured and the at least one signal generator comprises at least two signal generator signal paths, the processor is adapted to sweep phase and/or amplitude difference between the at least two signal generator signal paths and/or the at least two receiver signal paths on the basis of the measured grade of nulling. Advantageously, for example, measurement accuracy can further be increased.

According to a further preferred implementation form of the first aspect of the invention, especially in the case that the grade of nulling of the signal in the first receiver signal path is measured and the at least one signal generator comprises at least two signal generator signal paths, the processor comprises at least one of an application-specific integrated circuit, a digital signal processor, or a field programmable gate array. Advantageously, in this manner, costs can further be reduced, which leads to an increased measurement efficiency.

According to a second aspect of the invention, a measurement method for matching and/or transmission measurements with respect to a device under test comprising an interface is provided. Said measurement method comprises the steps of providing at least one signal generator comprising at least one signal generator signal path, providing at least one receiver comprising at least two receiver signal paths, and adaptively phase shifting a signal of a first signal generator signal path of the at least one signal generator signal path and/or a signal of a first receiver signal path of the at least two receiver signal paths with respect to a signal of a second receiver signal path of the at least two receiver signal paths. In addition or as an alternative to the foregoing step, the measurement method comprises the step of modifying the amplitude of the signal of the first signal generator signal path and/or the signal of the first receiver signal path with respect to the signal of the second receiver signal path.

Alternatively, with respect to said step of an adaptive phase shift, especially in the case that the at least one signal generator comprises at least two signal generator signal paths, the measurement method comprises the step of adaptively phase shifting a signal of a first signal generator signal path of the at least one signal generator signal path and/or a signal of a first receiver signal path of the at least two receiver signal paths with respect to a signal of a second receiver signal path of the at least two receiver signal paths and/or a signal of a second signal generator signal path of the at least two signal generator signal paths. In this context, additionally or alternatively, the measurement method comprises the step of modifying the amplitude of the signal of the first signal generator signal path and/or the signal of the first receiver signal path with respect to the signal of the second receiver signal path and/or the signal of the second signal generator signal path.

Advantageously, in this manner, the stability of calibration can be increased, which allows for highly accurate and efficient measurements. Further advantageously, asymmetry of at least one directive element of the measurement system may preferably be adjusted and/or compensated. In addition to this, as a further advantage, a balun is not necessary especially in order to realize the directivity of at least one component of the measurement system, which leads to an increased measurement efficiency.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
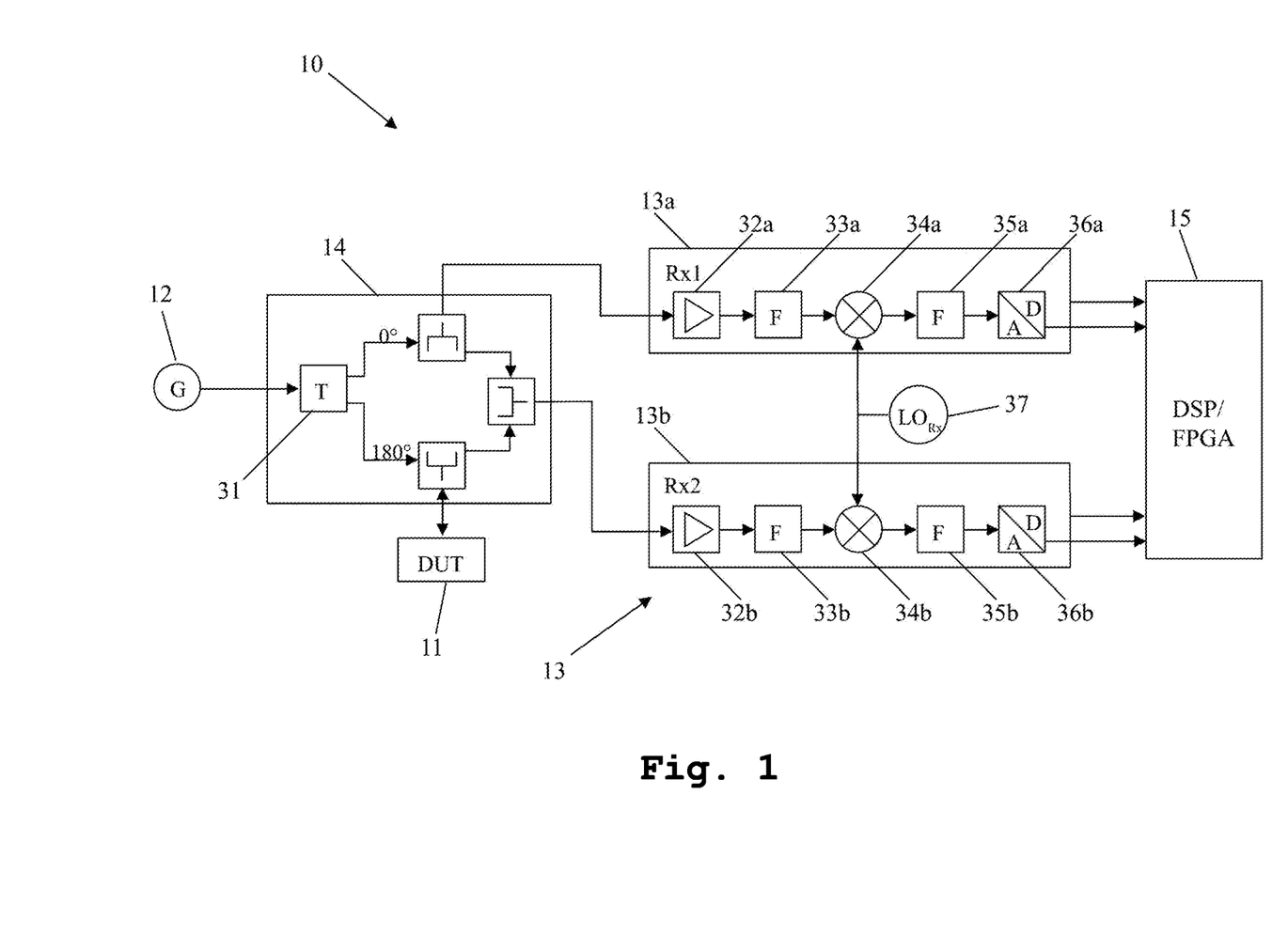
FIG. 1 shows an exemplary measurement system for matching and/or transmission measurements.

Firstly, FIG. 1 illustrates an exemplary measurement system for matching and/or transmission measurements with respect to a device under test 11 comprising an interface. Said measurement system 10 comprises a signal generator 12 comprising a signal generator signal path, and a receiver 13 comprising two receiver signal paths, especially a first receiver signal path 13a and a second receiver signal path 13b.

As it can further be seen from FIG. 1, the exemplary measurement system 10 further comprises a resistive measurement bridge 14. Exemplarily, said resistive measurement bridge 14 additionally comprises a balun in the from of a transformer 31 to which the signal generator 12 is connected.

In this context, the transformer 31 is adapted to realize the directivity of the resistive measurement bridge 14 and to generate the required 0 degree and 180 degrees signals.

Furthermore, the resistive measurement bridge 14 is not only connected to the interface of the device under test 11 but also to the first receiver signal path 13a and to the second receiver signal path 13b.

Within the first receiver signal path 13a, the respective signal from the resistive measurement bridge 14 is initially amplified with the aid of an amplifier 32a. The amplified signal is then filtered with the aid of first filter 33a and is afterwards mixed with a local oscillator signal generated by a local oscillator 37 with the aid of a mixer 34a. The respective mixed signal is passed to an analog-to-digital converter 36a via a second filter 35a. Finally, the respective digitalized signal is passed to a processing unit 15 comprising a digital signal processor and a field programmable gate array for further processing.

By analogy therewith, within the second receiver signal path 13b, the respective signal from the resistive measurement bridge 14 is initially amplified with the aid of an amplifier 32b. The amplified signal is then filtered with the aid of third filter 33b and is afterwards mixed with the above-mentioned local oscillator signal generated by the local oscillator 37 with the aid of a mixer 34b. The respective mixed signal is passed to an analog-to-digital converter 36b via a fourth filter 35b. Finally, the respective digitalized signal is passed to the above-mentioned processing unit 15 comprising a digital signal processor and a field programmable gate array for further processing.

Figure 2:
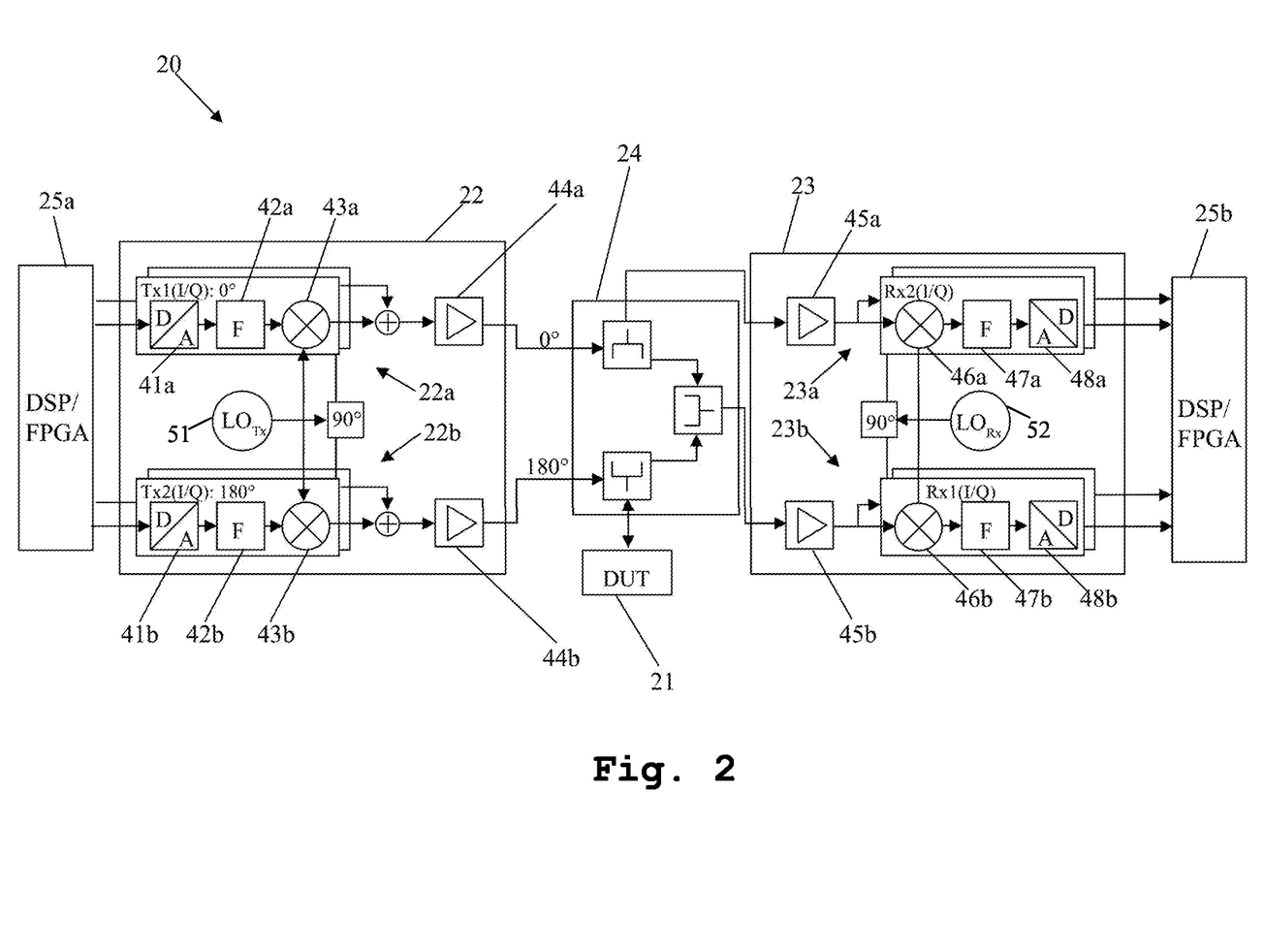
FIG. 2 shows an exemplary embodiment of the first aspect of the invention.

Now, with respect to FIG. 2, an exemplary embodiment of an inventive measurement system 20 for matching and/or transmission measurements with respect to a device under test 21 comprising an interface is illustrated. Said measurement system 20 comprises a signal generator 22 comprising two signal generator signal paths, especially a first signal generator signal path 22a and a second signal generator signal path 22b. In this context, it is noted that each of the two signal generator signal paths 22a, 22b is an I/Q-based signal path.

Additionally, the measurement system 20 further comprises a receiver 23 comprising two receiver signal paths, especially a first receiver signal path 23a, preferably a reference channel, and a second receiver signal path 23b, preferably a measurement channel. In this context, it is noted that each of the two receiver signal paths 23a, 23b is an I/Q-based signal path.

In further addition to this, the signal of the first signal generator signal path 22a or the signal of a first receiver signal path 23a is adaptively phase-shifted and/or amplitude-modified with respect to the signal of the second receiver signal path 23b or the signal of the second signal generator signal path 22b.

At this point, it should be mentioned that both the foregoing and the following explanations also apply if the receiver signal path 23a may be defined as the second receiver signal path, preferably the reference channel, whereas the receiver signal path 23b may be defined as the first receiver signal path, preferably the measurement channel.

As it can further be seen from FIG. 2, the first signal generator signal path 22a comprises a digital-to-analog converter 41a, wherein the digital input of the digital-to-analog converter 41a is fed with a corresponding digital signal generated by a processor 25a preferably comprising a digital signal processor and/or a field programmable gate array. After the digital-to-analog conversion, the respective analog signal is filtered with the aid of a first filter 42a, preferably a low pass filter. The respective filtered signal is then mixed with a local oscillator signal generated by a local oscillator 51. Afterwards, the respective mixed signal is amplified with the aid of an amplifier 44a and then outputted. Preferably, said output signal is a 0 degree signal.

By analogy therewith, the second signal generator signal path 22b comprises a digital-to-analog converter 41b, wherein the digital input of the digital-to-analog converter 41b is fed with a corresponding digital signal generated by the above-mentioned processor 25a preferably comprising a digital signal processor and/or a field programmable gate array. After the digital-to-analog conversion, the respective analog signal is filtered with the aid of a second filter 42b, preferably a low pass filter. The respective filtered signal is then mixed with a local oscillator signal generated by the above-mentioned local oscillator 51. Afterwards, the respective mixed signal is amplified with the aid of an amplifier 44b and then outputted. Preferably, said output signal is an 180 degrees signal.

In this context, it is noted that the at least one of the 0 degree signal and the 180 degrees signal may especially be generated with the aid of a direct digital synthesis synthesizer. Further alternatively, the 0 degree signal and the 180 degrees signal may preferably be generated by two separate direct digital synthesis synthesizers.

Advantageously, especially in the case that the measurement system according to the invention comprises at least one direct digital synthesis synthesizer, preferably two direct digital synthesis synthesizers, with the aid of said at least one direct digital synthesis synthesizer, preferably with the aid of said two direct digital synthesis synthesizers, phase and/or amplitude of the respective signal can independently be controlled. Further advantageously, in this manner, phase and/or amplitude asymmetries can be compensated especially with respect to analog portions of the measurement system.

In addition to this, as a further advantage, the compensation of phase and/or amplitude asymmetries can be tracked preferably by measuring a known reference load especially with the aid of the reference channel of the measurement system.

Furthermore, it is noted that not only the digital controllable adjustment and/or compensation of the asymmetry of at least one directive element of the measurement system is particularly advantageous but also the fact that the inventive measurement system allows for avoiding the usage of a balun such as the transformer 31 of FIG. 1. In this manner, especially due to the fact that such a balun has a frequency-dependent and/or power-dependent behavior, the avoidance of said element increases not only the stability of the respective calibration but also the measurement accuracy of the measurement system.

Moreover, as it can be seen from FIG. 2, the measurement system 20 further comprises a measurement bridge 24, preferably a resistive measurement bridge, for interconnecting the signal generator 22, the receiver 23, and the device under test 21.

It is further noted that the measurement bridge 24 is preferably adjustable in amplitude and phase with respect to at least one of the signal generator signal paths 22a, 22b.

In addition to this or as an alternative, the measurement bridge 24 is especially adjustable in amplitude and phase with respect to at least one of the two receiver signal paths 23a, 23b.

Furthermore, the interconnection with the aid of the measurement bridge 24 comprises a connection in which the first signal generator signal path 22a is connected to the first receiver signal path 23a and the second receiver signal path 23b and the interface of the device under test 21 and the second signal generator signal path 22b.

In addition to this, the interconnection with the aid of the measurement bridge 24 further comprises a connection in which the second signal generator signal path 22b is connected to the interface of the device under test 21 and the first receiver signal path 23a and the second receiver signal path 23b and the first signal generator signal path 22a.

Now, with respect to the receiver 23, it is noted that within the first receiver signal path 23a, the respective signal from the measurement bridge 24 is initially amplified with the aid of an amplifier 45a. The amplified signal is then mixed with a local oscillator signal generated by a local oscillator 52 with the aid of a mixer 46a. The respective mixed signal is passed to an analog-to-digital converter 48a via a first filter 47a, preferably a low pass filter. Finally, the respective digitalized signal is passed to a processor 25b preferably comprising a digital signal processor and/or a field programmable gate array for further measuring and/or processing.

By analogy therewith, within the second receiver signal path 23b, the respective signal from the measurement bridge 24 is initially amplified with the aid of an amplifier 45b. The amplified signal is then mixed with the above-mentioned local oscillator signal generated by the above-mentioned local oscillator 52 with the aid of a mixer 46b. The respective mixed signal is passed to an analog-to-digital converter 48b via a second filter 47b, preferably a low pass filter. Finally, the respective digitalized signal is passed to the above-mentioned processor 25b preferably comprising the digital signal processor and/or the field programmable gate array for further measuring and/or processing.

With respect to the two receiver signal paths 23a, 23b, it should be mentioned that the receiver 23 may comprise two receivers especially in order to replace said two receiver signal paths 23a, 23b.

With respect to the processor 25b of the measurement system 20, it is noted that the processor 25b is especially adapted to measure the grade of nulling of the signal of the second receiver signal path 23b.

In addition to this or as an alternative, the processor 25b may preferably be adapted to sweep phase and/or amplitude difference between the two signal generator signal paths 22a, 22b or the two receiver signal paths 23a, 23b on the basis of the measured grade of nulling.

Further additionally or further alternatively, the processor 25b may further comprise an application-specific integrated circuit.

Figure 3:
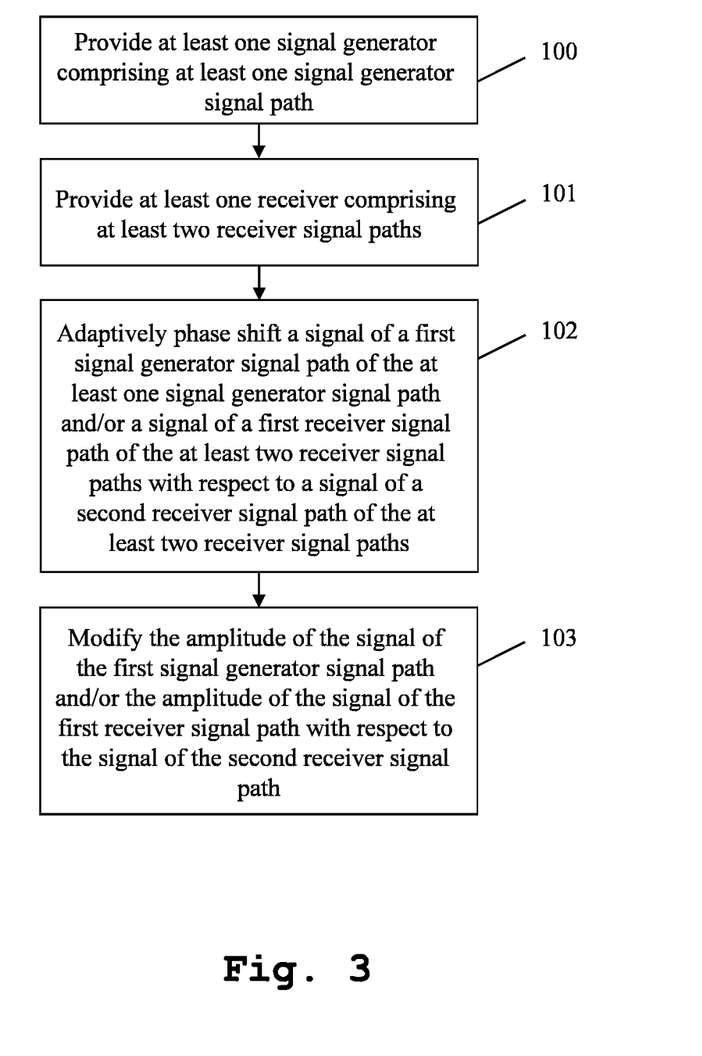
FIG. 3 shows a flow chart of an exemplary embodiment of the second aspect of the invention.

Finally, FIG. 3 shows a flow chart of an exemplary embodiment of the inventive measurement method for matching and/or transmission measurements with respect to a device under test comprising an interface. In a first step 100, at least one signal generator comprising at least one signal generator signal path is provided. Then, in a second step 101, at least one receiver comprising at least two receiver signal paths is provided. Furthermore, in a third step 102, a signal of a first signal generator signal path of the at least one signal generator signal path and/or a signal of a first receiver signal path of the at least two receiver signal paths are/is adaptively phase shifted with respect to a signal of a second receiver signal path of the at least two receiver signal paths. Additionally or alternatively to this step 102, as an additional or alternative step 103, the amplitude of the signal of the first signal generator signal path and/or the amplitude of the signal of the first receiver signal path are/is modified with respect to the signal of the second receiver signal path.

In addition to this, it is noted that the at least one signal generator may preferably comprise at least two signal generator signal paths.

In this context, the measurement method may especially comprise the step of adaptively phase shifting the signal of the first signal generator signal path of the at least two signal generator signal paths and/or the signal of the first receiver signal path of the at least two receiver signal paths with respect to a signal of a second signal generator signal path of the at least two signal generator signal paths.

Additionally or alternatively, the measurement method may especially comprise the step of modifying the amplitude of the signal of the first signal generator signal path of the at least two signal generator signal paths and/or the amplitude of the signal of the first receiver signal path of the at least two receiver signal paths with respect to a signal of a second signal generator signal path of the at least two signal generator signal paths.

Moreover, it is noted that the measurement method may further comprise the step of employing a measurement bridge for interconnecting at least two of the at least one signal generator, the at least one receiver, and the device under test. In other words, the measurement method may preferably comprise the step of interconnecting at least two of the at least one signal generator, the at least one receiver, and the device under test with the aid of a measurement bridge.

In this context, the measurement bridge may preferably be adjustable in amplitude and/or phase with respect to the at least one signal generator signal path.

In addition to this or as an alternative, the measurement bridge may especially be adjustable in amplitude and/or phase with respect to the at least two receiver signal paths.

Furthermore, the measurement method may preferably comprise the step of connecting the first signal generator signal path to the first receiver signal path and/or the second receiver signal path and/or the interface of the device under test.

Moreover, especially in the case that the at least one signal generator comprises at least two signal generator signal paths, the measurement method may preferably comprise the step of connecting the first signal generator signal path to the first receiver signal path and/or the second receiver signal path and/or the interface of the device under test and/or a second signal generator signal path of the at least two signal generator signal paths.

In addition to this, especially in the case that the at least one signal generator comprises at least two signal generator signal paths, the measurement method may preferably comprise the step of connecting a second signal generator signal path of the at least two signal generator signal paths to the interface of the device under test and/or the first receiver signal path and/or the second receiver signal path and/or the first signal generator signal path.

With special respect to the measurement bridge, it is noted that the interconnection with the aid of the measurement bridge may especially comprise a connection in which the first signal generator signal path is connected to the first receiver signal path and/or the second receiver signal path and/or the interface of the device under test.

In addition to this or as an alternative, especially in the case that the at least one signal generator comprises at least two signal generator signal paths, the interconnection with the aid of the measurement bridge may preferably comprise a connection in which the first signal generator signal path is connected to the first receiver signal path and/or the second receiver signal path and/or the interface of the device under test and/or a second signal generator signal path of the at least two signal generator signal paths.

Further additionally or further alternatively, especially in the case that the at least one signal generator comprises at least two signal generator signal paths, the interconnection with the aid of the measurement bridge may preferably comprise a connection in which a second signal generator signal path of the at least two signal generator signal paths is connected to the interface of the device under test and/or the first receiver signal path and/or the second receiver signal path and/or the first signal generator signal path.

Moreover, it should be mentioned that the at least one receiver may preferably comprise two receivers.

Furthermore, the measurement method may further comprise the step of measuring the grade of nulling of the signal of the second receiver signal path preferably with the aid of a processor.

In this context, especially in the case that the at least one signal generator comprises at least two signal generator signal paths, the measurement method may preferably comprise the step of sweeping phase and/or amplitude difference between the at least two signal generator signal paths and/or the at least two receiver signal paths on the basis of the measured grade of nulling especially with the aid of the processor.

In the case that the suggested processor is used for measuring, said processor may preferably comprise at least one of an application-specific integrated circuit, a digital signal processor, or a field programmable gate array.

Moreover, it is noted that the measurement method may further comprise the step of measuring the grade of nulling of the signal in the first receiver signal path especially with the aid of a processor. Advantageously, said processor for measuring the grade of nulling of the signal in the first receiver signal path may be the same one employed for measuring the grade of nulling of the signal of the second receiver signal path. Alternatively, two different processor may be used such as a first processor and a second processor.

Additionally or alternatively, especially in the case that the grade of nulling of the signal in the first receiver signal path is measured and the at least one signal generator comprises at least two signal generator signal paths, the measurement method may preferably comprise the step of sweeping phase and/or amplitude difference between the at least two signal generator signal paths and/or the at least two receiver signal paths on the basis of the measured grade of nulling especially with the aid of the processor.

It is further noted that said processor may preferably comprise at least one of an application-specific integrated circuit, a digital signal processor, or a field programmable gate array.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measurement system for matching and/or transmission measurements with respect to a device under test comprising an interface, the measurement system comprising:
   at least one signal generator comprising at least one signal generator signal path,
   at least one receiver comprising at least two receiver signal paths, wherein a signal of a first signal generator signal path of the at least one signal generator signal path and/or a signal of a first receiver signal path of the at least two receiver signal paths are/is adaptively phase-shifted with respect to a signal of a second receiver signal path of the at least two receiver signal paths, and wherein asymmetry of at least one directive element of the measurement system is adjusted and/or compensated, wherein the at least one directive element comprises a transformer.

2. The measurement system according to claim 1, wherein the first signal generator signal path is connected to the first receiver signal path and/or the second receiver signal path and/or the interface of the device under test.

3. The measurement system according to claim 1, wherein the at least one receiver comprises two receivers.

4. The measurement system according to claim 1, wherein the transformer is a balun.

5. The measurement system according to claim 1, wherein the transformer is included in a measurement bridge connected to the at least one signal generator.

6. The measurement system according to claim 1, wherein the at least one signal generator comprises at least two signal generator signal paths.

7. The measurement system according to claim 6, wherein the signal of the first signal generator signal path of the at least two signal generator signal paths and/or the signal of the first receiver signal path of the at least two receiver signal paths is adaptively phase-shifted and/or amplitude-modified with respect to a signal of a second signal generator signal path of the at least two signal generator signal paths.

8. The measurement system according to claim 6, wherein the first signal generator signal path is connected to the first receiver signal path and/or the second receiver signal path and/or the interface of the device under test and/or a second signal generator signal path of the at least two signal generator signal paths.

9. The measurement system according to claim 6, wherein a second signal generator signal path of the at least two signal generator signal paths is connected to the interface of the device under test and/or the first receiver signal path and/or the second receiver signal path and/or the first signal generator signal path.

10. The measurement system according to claim 1, wherein the measurement system further comprises a measurement bridge for interconnecting at least two of the at least one signal generator, the at least one receiver, and the device under test.

11. The measurement system according to claim 10, wherein the measurement bridge is adjustable in amplitude and/or phase with respect to the at least one signal generator signal path.

12. The measurement system according to claim 10, wherein the measurement bridge is adjustable in amplitude and/or phase with respect to the at least two receiver signal paths.

13. The measurement system according to claim 10, wherein the interconnection with the aid of the measurement bridge comprises a connection in which the first signal generator signal path is connected to the first receiver signal path and/or the second receiver signal path and/or the interface of the device under test.

14. The measurement system according to claim 10, wherein the at least one signal generator comprises at least two signal generator signal paths, wherein the interconnection with the aid of the measurement bridge comprises a connection in which the first signal generator signal path is connected to the first receiver signal path and/or the second receiver signal path and/or the interface of the device under test and/or a second signal generator signal path of the at least two signal generator signal paths.

15. The measurement system according to claim 10, wherein the at least one signal generator comprises at least two signal generator signal paths, wherein the interconnection with the aid of the measurement bridge comprises a connection in which a second signal generator signal path of the at least two signal generator signal paths is connected to the interface of the device under test and/or the first receiver signal path and/or the second receiver signal path and/or the first signal generator signal path.

16. The measurement system according to claim 1, wherein the measurement system further comprises a processor for measuring the grade of nulling of the signal of the second receiver signal path.

17. The measurement system according to claim 16, wherein the at least one signal generator comprises at least two signal generator signal paths, wherein the processor is adapted to sweep phase and/or amplitude difference between the at least two signal generator signal paths and/or the at least two receiver signal paths on the basis of the measured grade of nulling.

18. The measurement system according to claim 16, wherein the processor comprises at least one of an application-specific integrated circuit, a digital signal processor, or a field programmable gate array.

19. The measurement system according to claim 1, wherein the measurement system further comprises a processor for measuring the grade of nulling of the signal in the first receiver signal path.

20. The measurement system according to claim 19, wherein the at least one signal generator comprises at least two signal generator signal paths, wherein the processor is adapted to sweep phase and/or amplitude difference between the at least two signal generator signal paths and/or the at least two receiver signal paths on the basis of the measured grade of nulling.

21. The measurement system according to claim 19, wherein the processor comprises at least one of an application-specific integrated circuit, a digital signal processor, or a field programmable gate array.

22. A measurement method for matching and/or transmission measurements with respect to a device under test comprising an interface, the measurement method comprising the steps of:

providing at least one signal generator of a measurement system, the at least one signal generator comprising at least one signal generator signal path, providing at least one receiver of the measurement system, the at least one receiver comprising at least two receiver signal paths, and adaptively phase shifting a signal of a first signal generator signal path of the at least one signal generator signal path and/or a signal of a first receiver signal path of the at least two receiver signal paths with respect to a signal of a second receiver signal path of the at least two receiver signal paths, wherein asymmetry of at least one directive element of the measurement system is adjusted and/or compensated, wherein the at least one directive element comprises a transformer.

* * * * *